United States Patent
Hopper et al.

(10) Patent No.: US 6,940,133 B1
(45) Date of Patent: Sep. 6, 2005

(54) INTEGRATED TRIM STRUCTURE UTILIZING DYNAMIC DOPING

(75) Inventors: Peter J. Hopper, San Jose, CA (US); Philipp Lindorfer, San Jose, CA (US); Vladislav Vashchenko, Palo Alto, CA (US); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/818,039

(22) Filed: Apr. 5, 2004

(51) Int. Cl.[7] .......................... H01L 29/76; H01L 29/94
(52) U.S. Cl. ....................................... 257/379; 257/380
(58) Field of Search .............................. 257/379–380, 257/516, 536, 775

(56) References Cited

U.S. PATENT DOCUMENTS

| | | | |
|---|---|---|---|
| 5,293,058 A | * | 3/1994 | Tsividis ...................... 257/364 |
| 5,391,906 A | * | 2/1995 | Natsume ...................... 257/379 |
| 2004/0239477 A1 | * | 12/2004 | Landsberger et al. ........ 338/195 |

* cited by examiner

Primary Examiner—Phat X. Cao
Assistant Examiner—Theresa T. Doan
(74) Attorney, Agent, or Firm—Stallman & Pollock LLP

(57) ABSTRACT

An integrated circuit trim structure includes a dopant source, a target trim element formed in proximity to the dopant source, and a conductive heating element. The heater element is formed in proximity to the dopant source and includes first and second terminals and a trapezoid shaped region formed between the first and second terminals. As predefined current pulse is applied to the first terminal to promote current flow between the first and second terminals, a local heat source is created at a predefined location within the trapezoid shaped region and in proximity to the dopant source such that dopant flows from the dopant source into the target trim element to change the conductive characteristics of the target trim element.

1 Claim, 2 Drawing Sheets

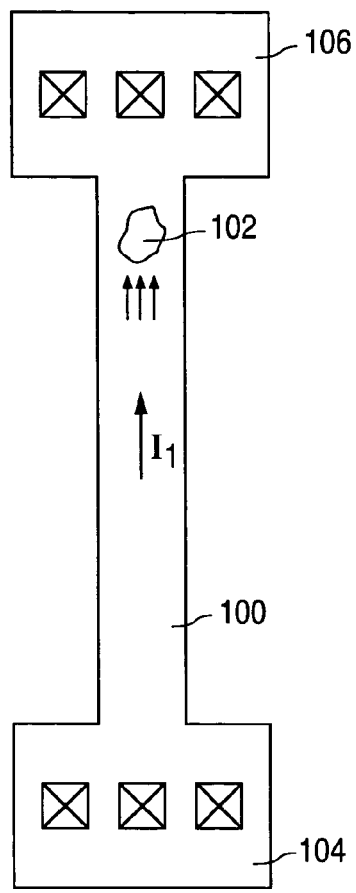
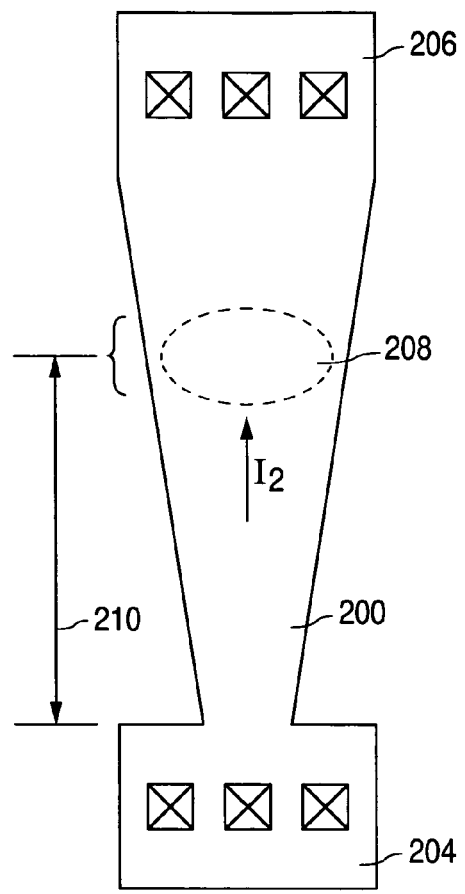
FIG. 1
(PRIOR ART)
FIG. 2
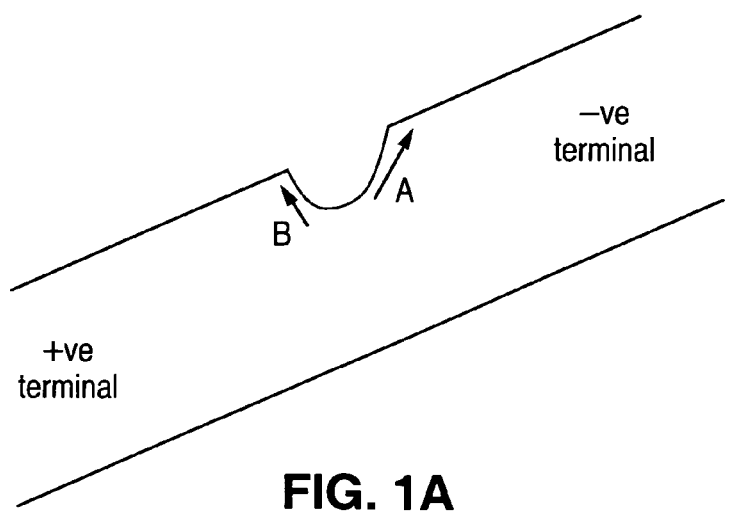
FIG. 1A

INTEGRATED TRIM STRUCTURE UTILIZING DYNAMIC DOPING

TECHNICAL FIELD

The present invention relates to an integrated circuit (IC) trim device structure that utilizes doping as the basis for changing bulk resistance and, thus, can be implemented at lower temperatures than conventional trim devices.

DESCRIPTION OF THE DRAWINGS

FIG. 1 is a layout drawing illustrating the natural tendency of a "hot spot" in an integrated circuit conductive element to migrate toward the positive terminal.

FIG. 1A is a band diagram of a polysilicon resistor with a centrally located "hot spot."

FIG. 2 is a layout drawing illustrating utilization of a trapezoid shaped conductive element to form a stable source of heat location in the conductive element.

DETAILED DESCRIPTION OF THE INVENTION

Figure 3:
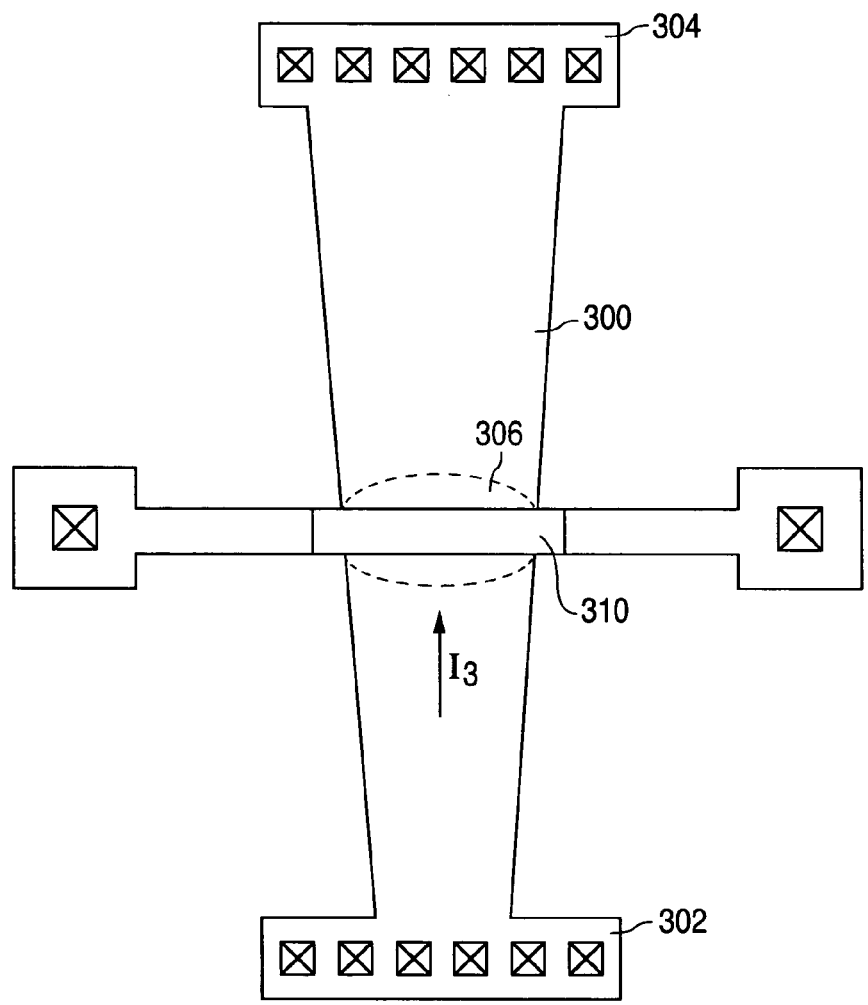
FIG. 3 is a layout drawing illustrating a trim element structure in accordance with the concepts of the present invention.

It is very well known that, as current flows through a conductor, the inherent resistance of the conductor causes some of the electrical energy to be converted to heat. That is, referring to FIG. 1, when a current $I_1$ is passed through a conductive element 100 (e.g. a polysilicon resistor), the resistance of the conductive element 100 opposes the current flow, causing a "hot spot" (represented pictorially by numeral 102 in FIG. 1) to migrate from the negative terminal 104 to the positive terminal 106 (assuming a conductive element 100 of N+ conductivity). As shown in the FIG. 1A band diagram of a polysilicon resistor, the "hot spot" presents a differential barrier to carriers, thus inducing more electron current in one direction than the other. This leads to a net electron current density that is higher towards the positive terminal. In other words, the "hot spot" will lead to band gap narrowing, and with an asymmetrical field. With reference to FIG. 1A, the E-field extends over a longer distance on side A of the "hot spot" in comparison with side B. Hence, net electron velocity and, thus, current, is higher in the side A region. This asymmetry, in turn, leads to a migration of the "hot spot." towards the positive terminal.

Referring to FIG. 2, it has been found that if a pulse of current $I_2$ is passed for a preselected time through a trapezoid shaped conductive element 200 that is predesigned to have a particular geometry and made from a material of known resistance, the migration of the "hot spot" resulting from the resistance of the conductive element can be predicted. In fact, for a given resistance of the conductive material forming the conductive element 200, and with the proper definition of the trapezoidal geometry of the conductive element 200, the migration of the "hot spot" (represented pictorially by numeral 202 in FIG. 2) between the negative terminal 204 and the positive terminal 206 (again assuming a conductive element 200 of N+ conductivity) can be controlled to provide a stable source of heat (represented pictorially by "heat bloom" 208 in FIG. 2) at a predictable specific location 210 along the length of the conductive element 200. The mechanism leading to this location stability is based upon the proper balance between current density and the natural migration tendency of the "hot spot." The present invention utilizes this phenomenon for the post fabrication doping of an integrated circuit trim device to change its bulk resistance.

As just stated, a trim device is an integrated circuit element the performance of which may be adjusted after fabrication. Trim devices are often unstable and inconsistent due to the fact that they rely upon very high levels of heating, supplied either by the resistive heating technique described above in conjuction with FIGS. 1 and 1A (e.g. fuse-based trim devices) or from an external laser source. Since these trimming techniques are performed after fabrication of the integrated circuit structure, their associated high temperatures can adversely effect the existing IC.

The present invention provides a trim device structure that requires temperatures of a lower level than conventional trim devices because it uses doping as the basis for a bulk resistance change, as opposed to the crystallographic or morphology transformations that are the basis of the conventional trimming mechanisms. Rapid thermal anneal processes are known to occur at a local temperature in the range of about 600°–1100° C.; time between 1 second and 30 minutes are also applicable.

In accordance with the present invention, the "localized resistive heating"concepts discussed above in conjunction with FIG. 2 are utilized to create a stable source of heat for a dopant source to facilitate dopant diffusion from the dopant source to a target trim element located in proximity to the dopant source, thereby changing the bulk resistance of the target trim element.

Figure 4:
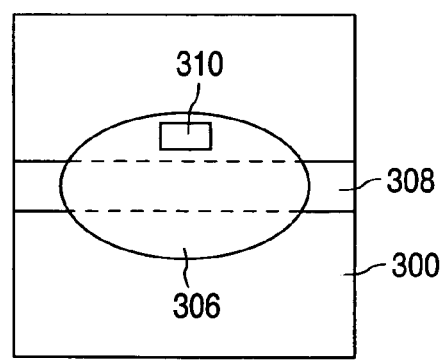
FIG. 4 is a partial cross-section drawing illustrating a portion of the FIG. 3 trim element structure.

Referring to FIGS. 3 and 4, in accordance with the invention, a transcient pulse of current $I_3$ of is supplied to a trapezoid shaped, N+ polysilicon conductive heating element 300 between a negative terminal 302 and a positive terminal 304. Because the conductivity of the N+ polysilicon from which the conductive element 300 is formed is known and because the trapezoid shape of the conductive element 300 has been specifically predefined, the location of a source of local heating (represented pictorially by numeral 306 in FIGS. 3 and 4) can be predicted with appropriate accuracy to form a dopant source in proximity to the local heat source 306. In the illustrated embodiment of the invention, the local heat source is a doped insulator 308 (e.g. ESG or PSG). As further illustrated in FIGS. 3 and 4, a target trim element (e.g. a resistor 310) is formed in proximity to, and preferably in direct contact with, the dopant source 308. The trapezoid shape is used to balance the current density, which will decrease as the trapezoid widens, versus the self heating related band gap narrowing mechanism, which leads to an asymmetrical E-field causing the "hot spot" to drift towards the positive terminal. This "hot spot" drift can be considered a consequence of electrons "seeing" a longer electric field on the negative side of the "hot spot" compared to the positive side, as discussed above with respect to the FIG. 1A band diagram.

As the current pulse $I_3$ passes through the heating element 300, heat from the heating element 300 facilitates diffusion of dopant from the dopant source 308 to the trim target element 310.

As stated above, in the disclosed embodiment of the invention, the trapezoid shaped heating element 300 is formed from N+ polysilicon and the geometry of the trapezoid shaped heating element is specifically designed to provide a stable heat source 306 at a predefined location along the length of the heating element 300. By preselecting either N-dopant or P-dopant in the dopant source, the resistance of the target trim element 310 can be adjusted up or down, respectively. The local heat source 302 causes dopant to diffuse from the dopant source 308 and into the target trim element 310. Once cooling has occurred, the target trim element 310 will exhibit a different resistance characteristic.

A similar effect can be achieved by laser heating, for example, by using lower power and a laser trimming equipment or, a different amount of short pulses.

Given the relatively large source of "external dopant" provided by the dopant source 308, the longer the time of the anneal process, the more significant the level of doping of the trim structure will occur, thereby providing better dynamic range for the trim process. The conventional alternative, annealing of an already doped film, provides far less control in that the dopant is already present, so that all that can be done is to activate or de-activate dopant from the grain boundaries into the grains or back again. With an "external" source of dopant, e.g. dopant source 308, the type and concentration of the dopant can be selected and, hence, the resistance can be shifted into the overall thermal budget with much greater flexibility.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An integrated circuit trim structure comprising:
   a dopant source;
   a target trim element formed in proximity to the dopant source; and
   a conductive heating element formed in proximity to the dopant source, the heating element including first and second terminals and a trapezoid shaped conductive region formed between the first and second terminals such that, when a predefined current is applied to the first terminal to provide current flow between the first and second terminals, a local source of heat is created at a predefined location in the trapezoid shaped region and in proximity to the dopant source such that dopant in the dopant source flows from the dopant source into the target trim element thereby changing conductive characteristics of the target trim element.

* * * * *